United States Patent
Yang et al.

(10) Patent No.: US 8,252,689 B2
(45) Date of Patent: Aug. 28, 2012

(54) CHEMICAL-MECHANICAL PLANARIZATION METHOD AND METHOD FOR FABRICATING METAL GATE IN GATE-LAST PROCESS

(75) Inventors: Tao Yang, Beijing (CN); Jinbiao Liu, Beijing (CN); Xiaobin He, Beijing (CN); Chao Zhao, Kessel-lo (BE); Dapeng Chen, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/142,736

(22) PCT Filed: Apr. 12, 2011

(86) PCT No.: PCT/CN2011/072643
§ 371 (c)(1),
(2), (4) Date: Jun. 29, 2011

(87) PCT Pub. No.: WO2012/071841
PCT Pub. Date: Jun. 7, 2012

(65) Prior Publication Data
US 2012/0135589 A1 May 31, 2012

(30) Foreign Application Priority Data
Nov. 30, 2010 (CN) .......................... 2010 1 0567260

(51) Int. Cl.
*H01L 21/302* (2006.01)
(52) U.S. Cl. .................. 438/692; 438/783; 257/E21.23
(58) Field of Classification Search .................. 438/531; 257/E21.191, E21.483
See application file for complete search history.

(56) References Cited

U.S. PATENT DOCUMENTS

| 6,756,643 B1 | 6/2004 | Achuthan et al. |
| 6,933,226 B2 | 8/2005 | Lee et al. |
| 7,229,904 B2 | 6/2007 | Kim |
| 2011/0312180 A1* | 12/2011 | Wang ............................ 438/692 |

FOREIGN PATENT DOCUMENTS

| CN | 1366332 A | 8/2002 |
| CN | 1638045 A | 7/2005 |
| CN | 1806340 A | 7/2006 |
| KR | 100700279 B1 | 3/2007 |

OTHER PUBLICATIONS

International Search Report and Written Opinion of the ISA (in Chinese) for PCT/CN2011/072643, ISA/CN, mailed Sep. 8, 2011.

* cited by examiner

*Primary Examiner* — Cheung Lee
(74) *Attorney, Agent, or Firm* — Harness, Dickey & Pierce, P.L.C.

(57) ABSTRACT

The present invention provides a chemical-mechanical planarization method. The chemical-mechanical planarization method includes: providing a substrate including a gate and source/drain regions on the sides of the gate, the gate and the source/drain regions being overlay by an insulating layer, and the insulating layer including a protruding part above the gate and a recessed part above a surface of the substrate between gates; selectively doping the insulating layer such that only the protruding part is doped; and performing CMP on the substrate after doping, to remove the protruding part and planarize the surface of the substrate. By selectively doping the insulating layer, the method makes only the protruding part of the insulating layer doped, enhancing the corrosive attacks on the material of the protruding part by the slurry in the CMP, and increasing the removal rate of the material of the protruding part by the CMP.

15 Claims, 8 Drawing Sheets

CHEMICAL-MECHANICAL PLANARIZATION METHOD AND METHOD FOR FABRICATING METAL GATE IN GATE-LAST PROCESS

CROSS-REFERENCE TO RELATED APPLICATION

This application is a Section 371 national stage application of International Application No. PCT/CN2011/072643 filed on Apr. 12, 2011, which claims priority to CN201010567260.9 filed on Nov. 30, 2010, the contents of which are incorporated herein by reference in their entirety.

FIELD OF THE INVENTION

The present invention relates to the field of integrated circuit technology, and in particular to a chemical-mechanical planarization method.

BACKGROUND OF THE INVENTION

Driven by increasing demands for ultra-large-scale integration and high performance of integrated circuits, semiconductor technology has been scaled down the 45 nm and even smaller technology node. The success of high-k metal-gate (HKMG) in the 45 nm technology node has made it key to the process flow for the sub-30 nm technology node. Intel, who has committed to a metal-gate-last approach, is the leader and only one manufacturer in mass production of 45 nm and 32 nm chips. And former IBM alliances such as Sumsung, TSMC and Infineon have recently switched the process development route from gate-first to gate-last.

The gate-last approach presents a challenge in developing the chemical and mechanical planarization (CMP) process. A gate-last process includes, generally, removing the silicon dioxide insulating layer and the silicon nitride insulating layer on top of the poly silicon (poly) gate by CMP such that the top of the poly gate is exposed, also known as, poly opening nitride polish (POP) CMP; then, removing the poly gate, filling the resulting trench with metal layers, and performing chemical-mechanical planarization of the metal layers in one or more steps, i.e., metal-gate CMP, such that only the metal within the trench is left, thereby obtaining the HKMG structure.

Figure 1:
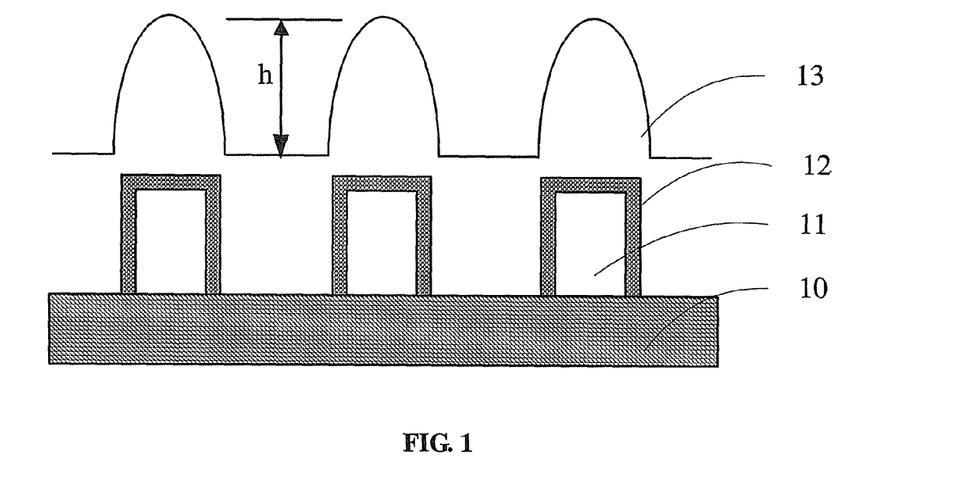
FIG. 1 and FIG. 2 illustrate a conventional POP CMP process.
Figure 2:
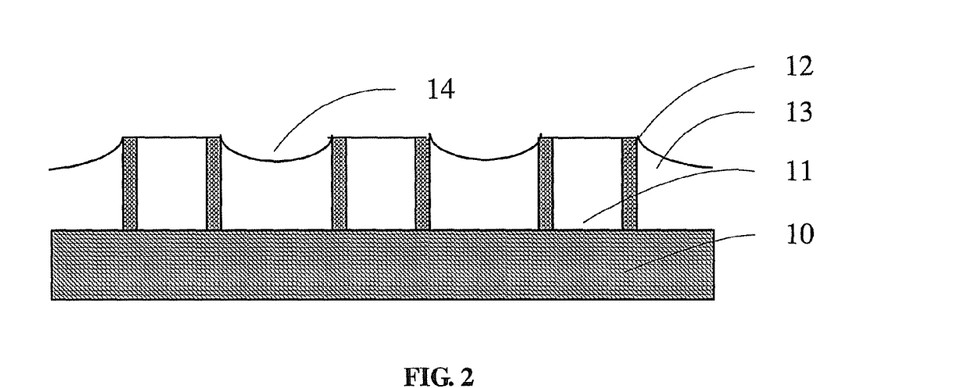
Figure 3:
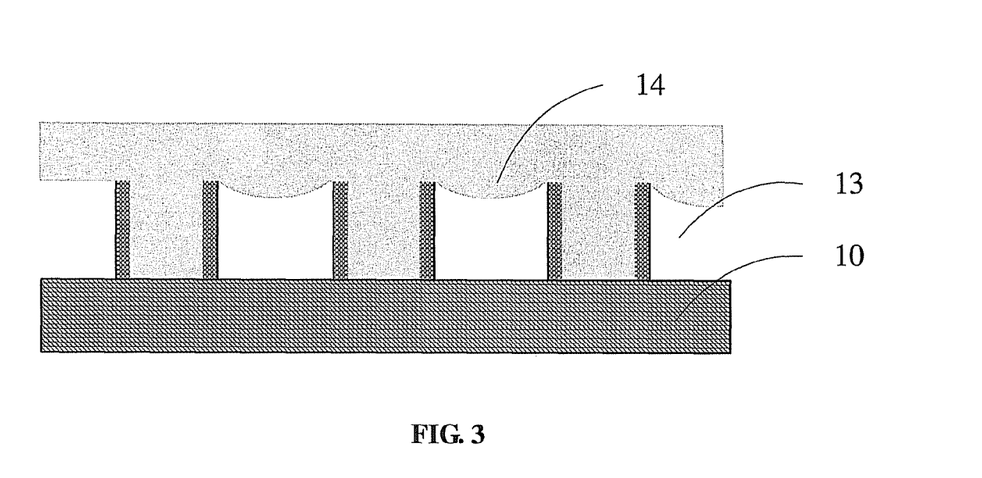
FIG. 3 and FIG. 4 illustrate a conventional metal gate CMP process after POP CMP process.
Figure 4:
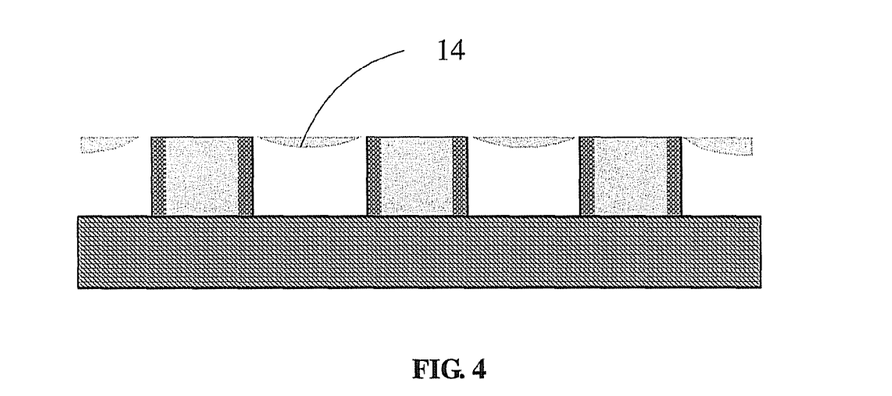

FIG. 1 and FIG. 2 illustrate a conventional POP CMP process, and FIG. 3 and FIG. 4 illustrates a conventional metal gate CMP process. As shown in FIG. 1 and FIG. 2, a poly gate 11 is formed on a substrate 10, and overlay by a silicon nitride insulating layer 12 and then a silicon dioxide insulating layer 13. The POP CMP includes: firstly, CMP of the silicon dioxide insulating layer 13, exposing the silicon nitride insulating layer on top of the poly gate 11; and secondly, CMP of the silicon nitride insulating layer 12, exposing the poly gate 11. High within-die uniformity is required for both of the CMP processes, especially the CMP of the silicon dioxide insulating layer.

However, due to high poly gate density, and height differences between gates before silicon dioxide insulating layer deposition, approximately 1000 Å to 1800 Å, the thickness variation h of the silicon dioxide insulating layer 13 on top of the poly gate 11 and on the source/drain area (not shown) after silicon dioxide insulating layer deposition can be 1000 Å to 4000 Å, or even more. Conventional silicon dioxide CMP processes can not resolve a thickness variation as large as this, and it will be passed down when silicon dioxide insulating layer 13 CMP goes. As shown in FIG. 2, the variation results in a dishing 14 on the remaining silicon dioxide insulating layer 13 between poly gates 11, which can not be covered by the following CMP of the silicon nitride insulating layer 12, and may even be enlarged due to CMP process, such as slurry selectivity. As shown in FIG. 3 and FIG. 4, the dishing 14 on the silicon dioxide insulating layer will be filled with metal in a subsequent metal-gate deposition process, drastically limiting the tuning range of metal-gate CMP process, resulting in metal residue between gates and causing a short circuit in the device.

SUMMARY OF THE INVENTION

A problem to be solved by the present invention is to provide a chemical-mechanical planarization method, with improved within-die uniformity and thereby preventing short circuits in the device.

To solve the problem above, the present invention provides a chemical-mechanical planarization (CMP) method, including:
providing a substrate including a gate and source/drain regions on the sides of the gate, the gate and the source/drain regions being overlay by an insulating layer, and the insulating layer including a protruding part above the gate and a recessed part above a surface of the substrate between gates;
selectively doping the insulating layer such that only the protruding part is doped; and
performing CMP on the substrate after doping, to remove the protruding part and planarize the surface of the substrate.

The selectively doping the insulating layer includes:
forming a mask layer with a pattern of the protruding part on the insulating layer, exposing the protruding part;
performing ion implantation such that the protruding part is doped; and
removing the mask layer.

Preferably, the mask layer is a photoresist layer.

Preferably, in the process of ion implantation, ion implantation has a depth equal to or smaller than a thickness difference between the protruding part and the recessed part.

The range of ion energy is determined according to the thickness difference.

The material for the insulating layer includes silicon dioxide.

Optionally, ions used in the ion implantation include at least one of: H, C, N, B, BF2, In, P, As and Sb.

The process of CMP uses alkali SiO2-based slurry or alkali CeO2-based slurry; and uses a hard pad or a soft pad.

The present invention provides a method for fabricating a metal gate in gate-last process, including:
providing a substrate including a dummy gate and source/drain regions on the sides of the dummy gate, the dummy gate and the source/drain regions being overlay by an insulating layer, and the insulating layer including a protruding part above the dummy gate and a recessed part above a surface of the substrate between dummy gates;
selectively doping the insulating layer such that only the protruding part is doped;
performing first CMP, to remove the protruding part such that a first insulating layer on top of the dummy gate is exposed;
performing second CMP, to remove the first insulating layer on the top of the dummy gate such that the dummy gate is exposed;
removing the dummy gate such that a gate trench is formed;
filling the gate trench with metal; and performing third CMP, to remove excess metal on the surface of the substrate outside the gate trench and form a metal gate.

Compared with the prior art, the technical solution above has the following advantages.

Selectively doping is performed on the insulating layer, and only the protruding part of the insulting layer is doped, destroying the chemical bonds and crystal structures in the protruding part of the insulting layer. Hence, the corrosive attacks on the material of the protruding part by the slurry in the CMP are enhanced, and the removal rate of the material of the protruding part by the CMP is greatly increased, thereby improving the within-die uniformity of the process, avoiding the thickness variation of the insulating layer being passed down the planarized substrate surface, and reducing or even eliminating the dishing on the insulating layer between gates.

Consequently, in the subsequent process of metal-gate formation, there will not be metal residue in the insulating layer between gates, thereby preventing short circuits in the device.

BRIEF DESCRIPTION OF THE DRAWINGS

The above and other objectives, features and advantages of the present invention will become apparent from the following description when taken in conjunction with the accompanying drawings. In the accompanying drawings, the same or corresponding technical features or components will be represented by the same or corresponding reference numerals. It should be noted, the accompanying drawings are for illustrative purposes only, and are not necessarily proportional.

DETAILED DESCRIPTION OF THE INVENTION

For better understanding of the objectives, features and advantages of the present invention, embodiments of the present invention will be described hereinafter with reference to the accompanying drawings.

Various details disclosed herein are for exemplary purposes only. The present invention can be implemented in a way that is not disclosed herein, and many alternations and modifications can be made by those skilled in the art without deviation from the scope of the present invention, hence, the present invention is not limited to the embodiments disclosed herein.

Moreover, the embodiments of the present invention are described herein with reference to the accompanying drawings. For clarity purposes, the sectional views representing device structures are not necessarily proportional; and the accompanying drawings are for illustrative purposes only, which should not be interpreted as limiting the scope of the present invention. In addition, three-dimensional parameters including length, width and depth should be included in practical applications.

As described in the BACKGROUND OF THE INVENTION, the gate-last approach used in the mass production of 45 nm and beyond, chips has a possibility of short circuit risk during CMP process; the inventors found that this may be caused by the metal residue between gates after metal-gate CMP, and metal residue may be induced by POP CMP's inability to resolve the surface topography from thickness variation of the silicon dioxide insulating layer. Therefore, the key to avoid short circuit concern is to improve the within-die uniformity of CMP, especially, to avoid the oxide dishing on the silicon dioxide insulating layer after POP CMP.

Accordingly, the present invention provides a CMP method, including: providing a substrate including a gate and source/drain regions on the sides of the gate, the gate and the source/drain regions being overlay by an insulating layer, and the insulating layer including a protruding part above the gate and a recessed part above a surface of the substrate between gates; selectively doping the insulating layer such that only the protruding part is doped; and performing CMP on the substrate after doping, to remove the protruding part and planarize the surface of the substrate. An embodiment of the CMP method of the present invention is described below with reference to the accompanying drawings.

EMBODIMENT 1

Figure 5:
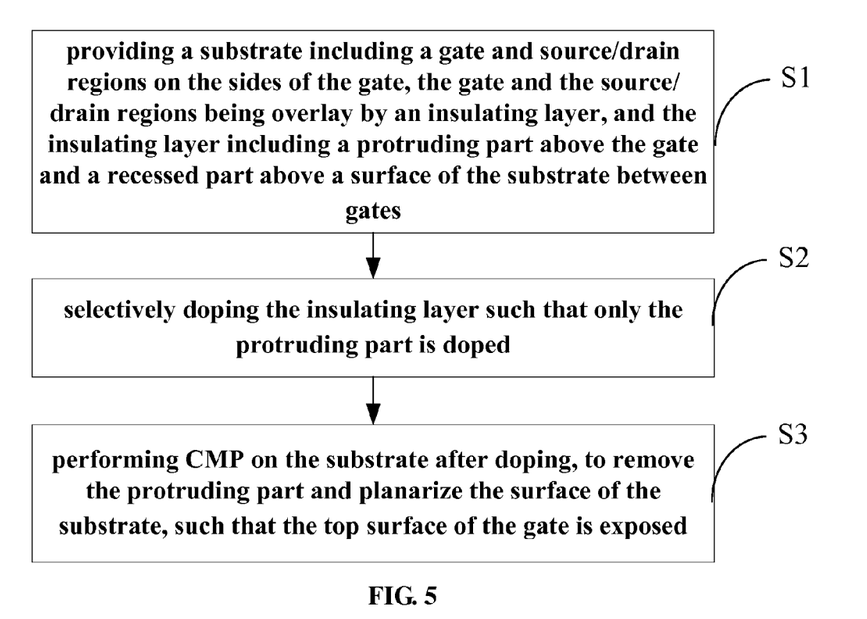
FIG. 5 illustrates a flow chart of a CMP method according to a first embodiment of the present invention.
Figure 6:
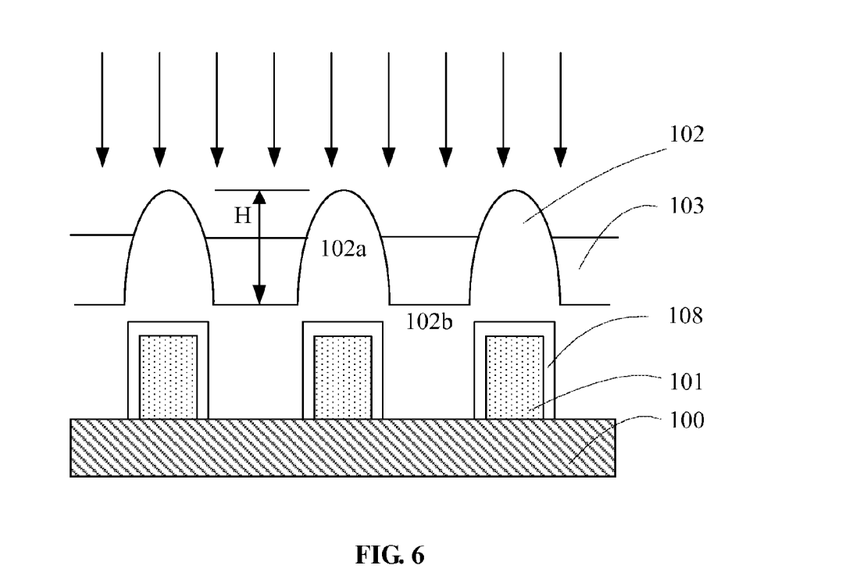
FIG. 6—FIG. 8 illustrate a CMP method according to the first embodiment of the present invention.
Figure 7:
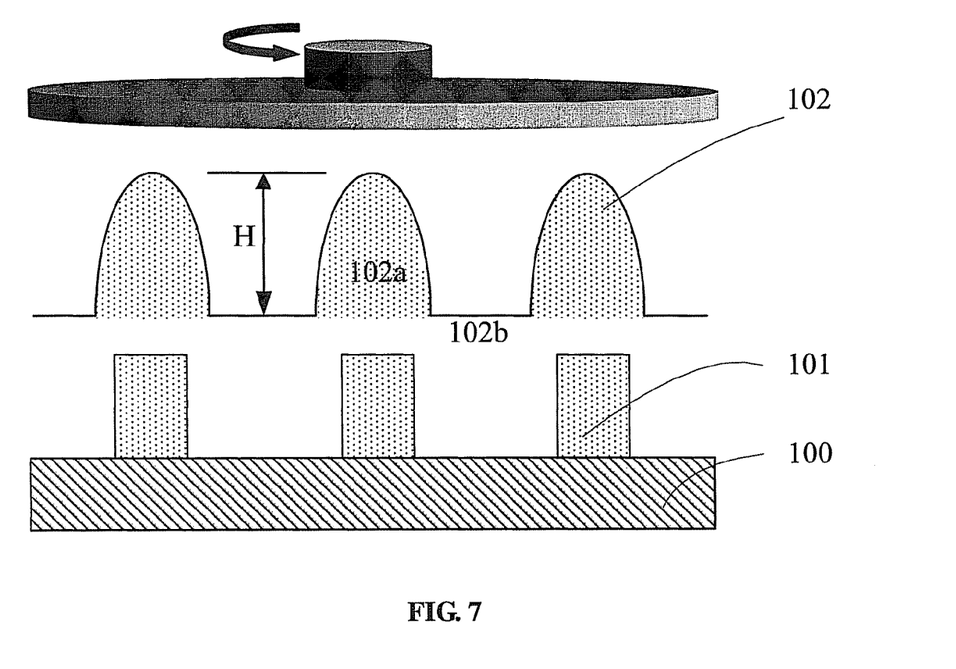
Figure 8:
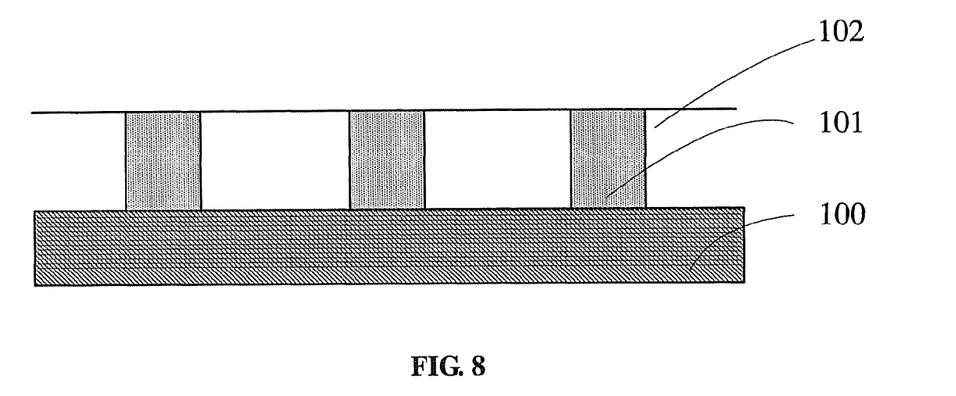

FIG. 5 illustrates a flow chart of a CMP method according to the embodiment; and FIG. 6—FIG. 8 illustrate the CMP method according to the embodiment.

As shown in the figures, the method includes:

Step S1: as shown in FIG. 6, a substrate 100 is provided, including a gate 101 and source/drain regions (not shown) on the sides of the gate 101, the gate 101 and the source/drain regions are overlay by an insulating layer 102, and the insulating layer 102 includes a protruding part 102a above the gate and a recessed part 102b above the surface of the substrate between the gates 101.

Step S2: selective doping is performed on the insulating layer 102, such that only the protruding part 102a is doped. Preferably, in this embodiment, the selective doping is ion implantation; and a mask layer 103 covers the recessed part 102b of the insulating layer 102, with only the protruding part 102a exposed, and the protruding part 102a is doped through ion implantation in the direction shown in FIG. 6.

For example, the mask layer 103 is a photo-resist layer. After formation of the insulating layer 102, the whole substrate is coated with a photoresist, then by using a mask (not shown) with a pattern of the protruding part 102a of the insulating layer, a mask layer 103 with the pattern of the protruding part is formed through alignment, exposure and developing, so that the protruding part 102a is exposed and the recessed part 102b between the gates 101 is covered.

According to the thickness difference H (see FIG. 7) between the protruding part 102a and the recessed part 102b, a proper ion implantation condition can be determined; and ion implantation is performed on the protruding part 102a with the presence of the photoresist layer 103. The depth of ion implantation can be equal to or smaller than the thickness difference H, and the range of ion energy can be determined according to the thickness difference H.

After ion implantation, the photoresist layer is removed by a wet method or a dry method, and the substrate 100 is dried. The condition of photoresist removal should be carefully chosen, without damaging the doped protruding part.

Step S3: as shown in FIG. 7, CMP is performed on the substrate 100 after doping, to remove the protruding part 102a and planarize the surface of the substrate 100, such that the top surface of the gate 101 is exposed, thereby obtaining a planarized substrate as shown in FIG. 8.

With the protruding part 102a of the insulating layer 102 doped, its chemical bonds and crystal structures of silicon oxide are destroyed. Hence, the corrosive attacks on the material of the protruding part 102a by the slurry in the CMP are enhanced, and the removal rate of the material of the protruding part by the CMP is greatly increased, thereby improving the within-die uniformity of the process, avoiding the thickness variation of the insulating layer 102a being passed on to the planarized substrate surface, and reducing or even eliminating the dishing on the insulating layer between the gates.

An embodiment of the CMP method is described below with reference to the accompanying drawings.

EMBODIMENT 2

As an example, a gate-last method for fabricating a typical 32 nm metal gate is described, to show another embodiment of the CMP method. FIG. 9—FIG. 16 illustrate a method for fabricating a metal gate in gate last process according to the embodiment.

Figure 9:
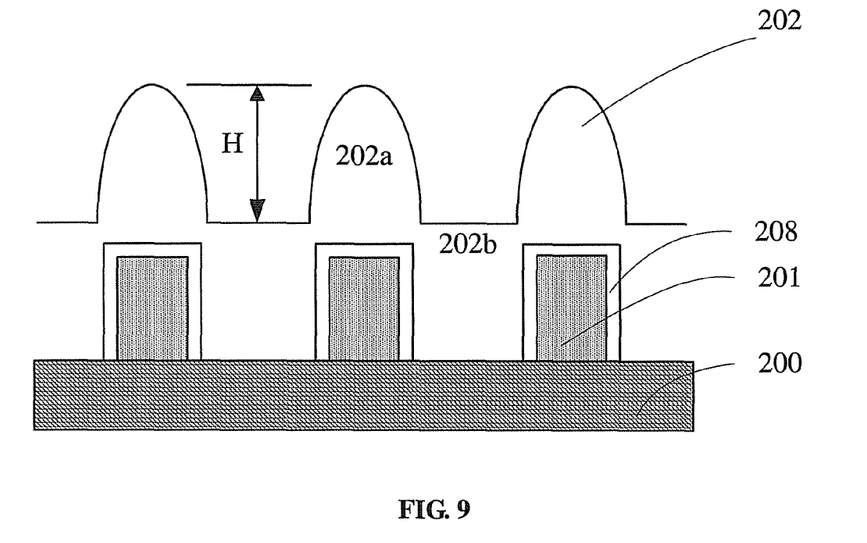
FIG. 9—FIG. 16 illustrate a method for fabricating a metal gate in gate last process according to a second embodiment of the present invention.

As shown in FIG. 9, a substrate 200 is provided, the substrate 200 includes a dummy gate 201, a gate oxide layer (not shown) and source/drain regions (not shown) on the sides of the dummy gate 200, and the dummy gate 201 and the source/drain regions are overlay by a first insulating layer 208 and a second insulating layer 202.

Specifically, the substrate 200 may be formed of an elemental semiconductor, e.g., monocrystalline, polycrystalline or amorphous silicon, or monocrystalline, polycrystalline or amorphous silicon-germanium (SiGe); or a compound semiconductor, e.g., silicon carbide (SiC), indium antimonide (InSb), lead telluride (PbTe), indium arsenide (InAs), indium phosphide (InP), gallium arsenide (GaAs), or gallium antimonide (GaSb), or an alloyed semiconductor, or a combination of the foregoing. The substrate 200 may also include a buried oxide layer and a SOI layer, and the SOI layer may be made of, e.g., Si, Ge or a III-V Compound such as SiC, GaAs, InP and InAs.

The dummy gate may be made of poly silicon, by a conventional poly silicon gate process. The gate oxide layer may be made of silicon dioxide, by furnace oxidation, rapid thermal annealing oxidation or in-situ vapor oxidation; or the gate oxide layer may be made of silicon oxynitride, by nitriding the oxide, specifically, by furnace nitriding, rapid thermal annealing nitriding or plasma nitriding.

The source/drain regions in the substrate 200 may be made by an ion implantation process; and depending on the type of the device, different kinds of dopant ions may be used, e.g., n-type dopant ions may be B or In, and p-type dopant ions may be P or As.

In this embodiment, the first insulating layer 208 is a silicon nitride layer, and the second insulating layer 202 is a silicon dioxide layer. The first insulating layer 208 and the second insulating layer 202 may be part of the sidewall of the final gate. Specifically, the thickness of the silicon nitride layer 208 may be 10-30 nm, and the thickness of the silicon dioxide layer may be 100-150 nm.

Due to high device density of the chip, small distance between the gates, and the height differences between gates, the second insulating layer 202 on the surface of the substrate 200 presents a rugged structure. The second insulating layer 202 includes a protruding part 202a above the dummy gate 201 and a recessed part 202b above the surface of the substrate between the dummy gates 201; and the surface of the protruding part 202a and the surface of the recessed part 202b has a difference in height, H. The rugged surface will affect the subsequent metallization process and should be planarized.

Figure 10:
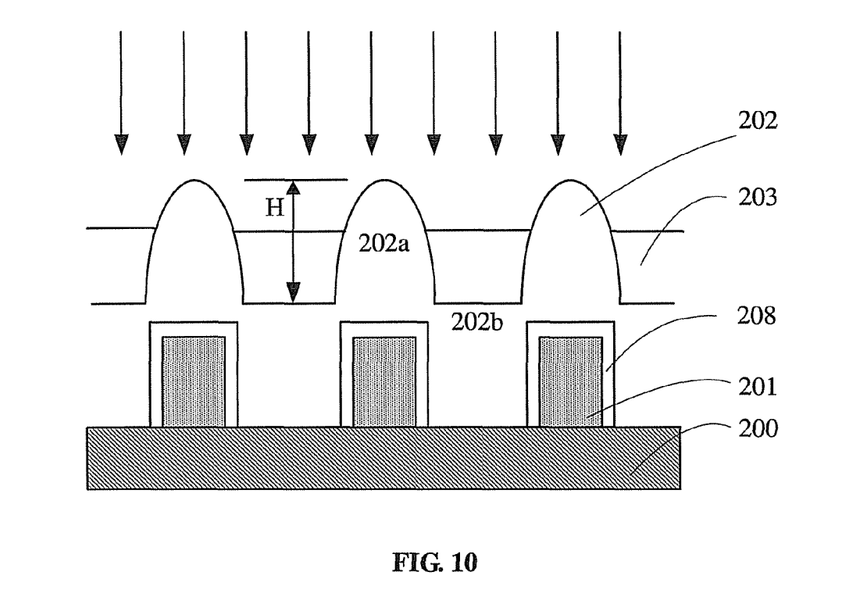

As shown in FIG. 10, selective doping is performed on the second insulating layer 202 such that only the protruding part 202a is doped.

Specifically, in this embodiment, after formation of the second insulating layer 202, the whole substrate 200 is coated with a photoresist, then by using a mask (not shown) with a pattern of the protruding part 202a of the second insulating layer, a mask layer 203 with the pattern of the protruding part is formed through alignment, exposure and developing, so that the protruding part 202a is exposed and the recessed part 202b between the dummy gates 201 is covered. The thickness of the photoresist layer 203 can be smaller than the difference H, or larger than the difference H.

Then, ion implantation is performed with the presence of the photoresist layer 203. In the process of ion implantation, the depth of ion implantation can be equal to or smaller than the thickness difference H between the protruding part and the recessed part. That is, the selective doping makes all or a portion of the protruding part 202a doped, and leaves the portion that is below the surface of the recessed part 202b undoped.

For some specific kinds of dopant ions, the depth of implantation can be controlled by controlling the range of ion energy, and the ion energy can be determined according to the thickness difference H. For example, if the range of the thickness difference is 1000 Å to 3000 Å, then the range of ion energy is 10 KeV to 150 KeV.

In this embodiment, dopant ions include at least one of: H, C, N, B, BF2, In, P, As and Sb; and the dose range is 1E14 cm-2 to 5E15 cm-2.

After ion implantation, the photoresist layer 203 is removed by a wet method or a dry method, and the substrate is dried. The condition of photoresist removal should be carefully chosen, without damaging the doped protruding part 202a.

Figure 11:
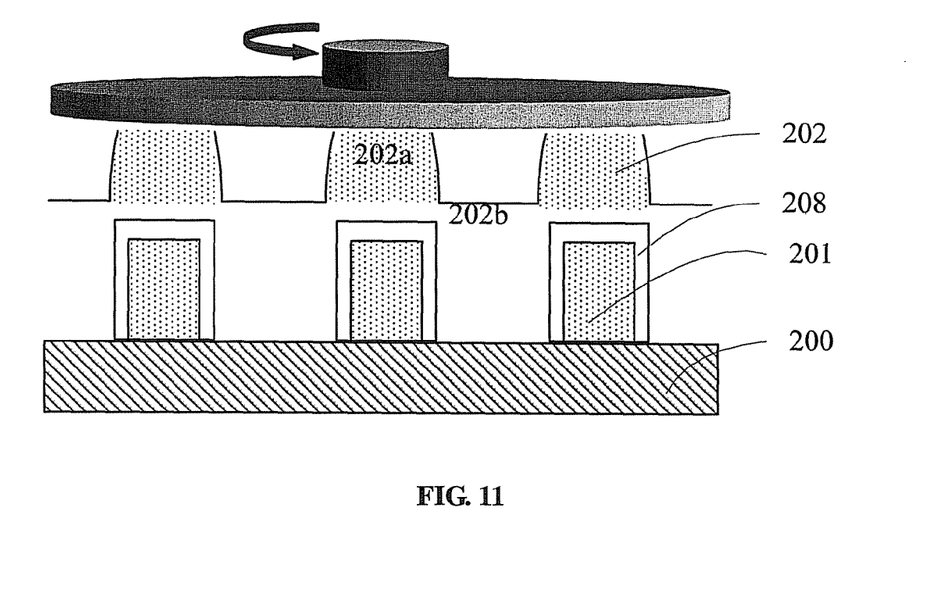
Figure 12:
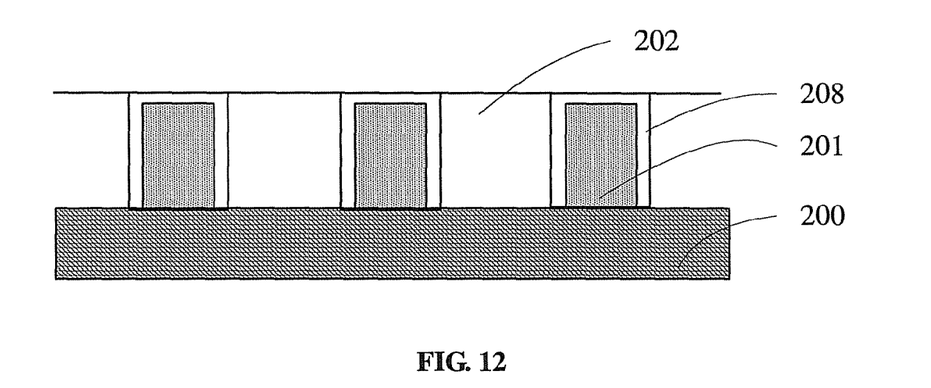

Then, as shown in FIG. 11 and FIG. 12, first CMP is performed, to remove the protruding part 202a such that the first insulating layer 208 on top of the dummy gate is exposed. The slurry used in the first CMP may be an alkali $SiO_2$-based slurry or an alkali $CeO_2$-based slurry; and the pad may be a hard pad or a soft pad.

With the protruding part 202a of the second insulating layer 202 doped, its chemical bonds and crystal structures are destroyed. Hence, the corrosive attacks on the material of the protruding part 202a by the slurry in the CMP are enhanced, and the removal rate of the material of the protruding part by the CMP is greatly increased, thereby improving the within-die uniformity of the process, avoiding the thickness variation of the insulating layer 202a being passed on to the planarized substrate surface, and reducing or even eliminating the dishing on the insulating layer between the gates.

Figure 13:
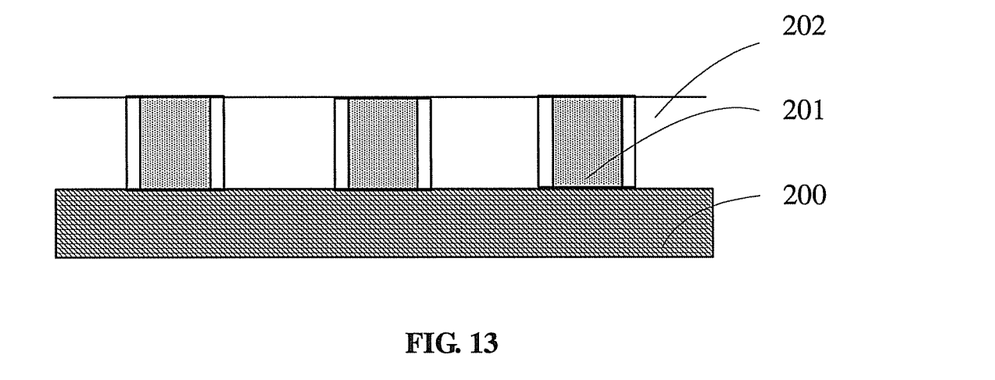

As shown in FIG. 13, second CMP is performed, to remove the first insulating layer 208 on the top of the dummy gate 201 such that the surface of the top of dummy gate is exposed. This process of CMP uses slurry and a pad with high selectivity against silicon nitride.

The first and second CMP are known as the poly-open-polish (POP) CMP.

Figure 14:
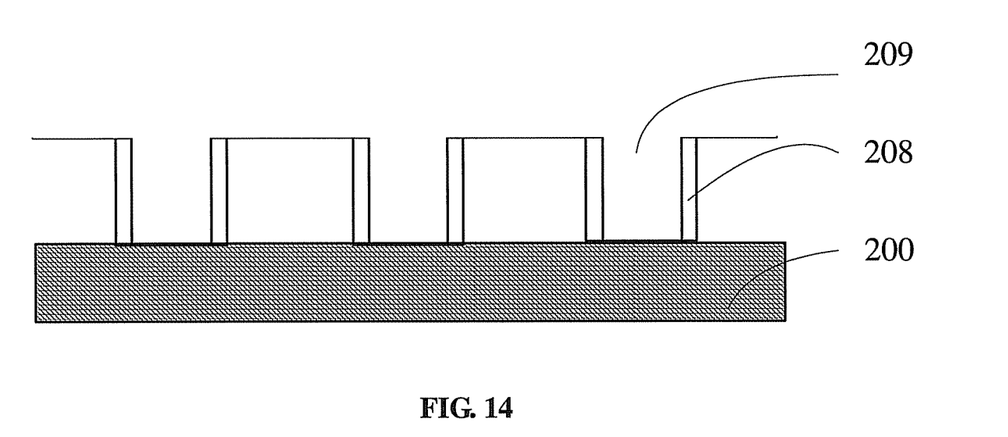

As shown in FIG. 14, the dummy gate 201 is removed and a gate trench 209 is left. Specifically, the dummy gate 201 is removed by a wet method or a dry method (see FIG. 12), and the gate oxide layer (not shown) is exposed, thereby forming a gate trench 209 in the first and second insulating layers where used to be the dummy gate 201.

Figure 15:
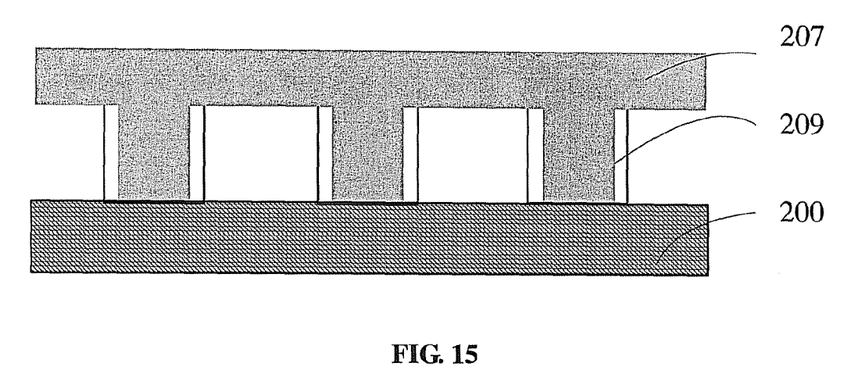

As shown in FIG. 15, the gate trench 209 is with metal.

Specifically, a high-k dielectric layer is deposited (not shown) in the gate trench 209. The high-k dielectric layer may be made of, e.g., HfO2, HfTiO, HfSiON, HfTaO, HfTiO, HfZrO, Al2O3, La2O3, ZrO2 or LaAlO; and the thickness of the high-k dielectric layer 113 can range from 1 nm to 3 nm. Together, the high-k dielectric layer and the gate oxide layer form a gate dielectric layer. Then, a surface-deposited metal layer 207 including the high-k dielectric layer is formed.

Before deposition of the metal layer 207, a thin metal layer for tuning the work function (not shown) is deposited. For an n-type device, the material for the thin metal layer may be TaC, TiN, TaTbN, TaErN, TaYbN, TaSiN, HfSiN, MoSiN, RuTax or NiTax; and for a p-type device, the material for the thin metal layer for tuning the work function may be MoNx, TiSiN, TiCN, TaAlC, TiAlN or TaN. The material for the subsequently-deposited metal layer may be Al or TiAl.

Figure 16:
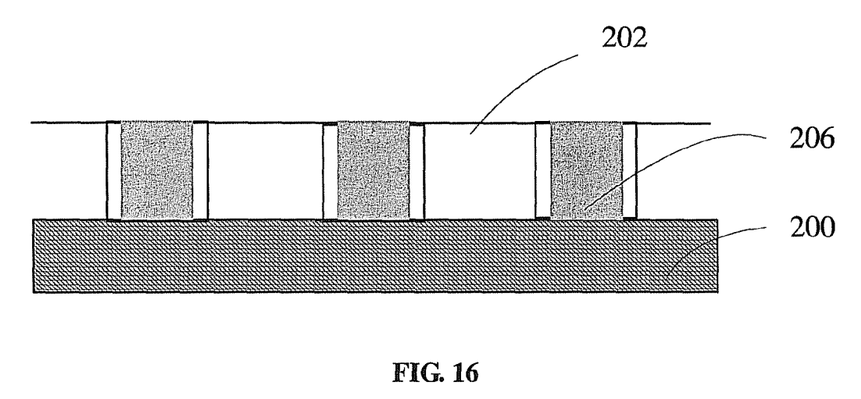

As shown in FIG. 16, third CMP is performed, to remove excess metal on the surface of the substrate outside the gate trench and form a metal gate 206 inside the gate trench 209. This process of CMP is known as metal-gate CMP. Because the within-die uniformity of POP CMP is improved, the thickness variation of the second insulating layer will not be passed down the planarized substrate surface, reducing or even eliminating the metal residue on the second insulating layer between the gates. Therefore, in the process of metal-gate CMP, there will not be excess metal in the second insulating layer 202 between the gates, thereby preventing device short circuit risk induced by CMP process.

Preferred embodiments of the present invention are disclosed above, which should not be interpreted as limiting the scope of the invention in any ways.

The present invention is disclosed above in connection with the preferred embodiments. It should be noted that the embodiments disclosed herein should not be interpreted as limiting the scope of the invention. Alternations and modifications may be made to the technical solution of the invention by those skilled in the art without deviation from the scope of the invention. Hence, any modifications, equivalents and alterations made based on the technical principle of the present invention without deviation from the scope of the invention should fail within the scope of protection of the invention.

The invention claimed is:

1. A chemical-mechanical planarization (CMP) method, comprising:
   providing a substrate comprising a gate and source/drain regions on the sides of the gate, the gate and the source/drain regions being overlay by an insulating layer, and the insulating layer comprising a protruding part above the gate and a recessed part above a surface of the substrate between gates;
   selectively doping the insulating layer such that only the protruding part is doped; and
   performing CMP on the substrate after doping, to remove the protruding part and planarize the surface of the substrate.

2. The CMP method according to claim 1, wherein, the selectively doping the insulating layer comprises:
   forming a mask layer with a pattern of the protruding part on the insulating layer, exposing the protruding part;
   performing ion implantation such that the protruding part is doped; and
   removing the mask layer.

3. The CMP method according to claim 2, wherein, in the process of ion implantation, ion implantation has a depth equal to or smaller than a thickness difference between the protruding part and the recessed part.

4. The CMP method according to claim 2, wherein, the material for the insulating layer comprises silicon dioxide.

5. The CMP method according to claim 2, wherein, ions used in the ion implantation comprise at least one of: H, C, N, B, $BF_2$, In, P, As and Sb.

6. The CMP method according to claim 1, wherein, the mask layer is a photoresist layer.

7. The CMP method according to claim 6, wherein, in a process of ion implantation, ion implantation has a depth equal to or smaller than a thickness difference between the protruding part and the recessed part.

8. The CMP method according to claim 6, wherein, the material for the insulating layer comprises silicon dioxide.

9. The CMP method according to claim 3, wherein, ions used in an ion implantation comprise at least one of: H, C, N, B, $BF_2$, In, P, As and Sb.

10. The CMP method according to claim 1, wherein, in a process of ion implantation, ion implantation has a depth equal to or smaller than a thickness difference between the protruding part and the recessed part.

11. The CMP method according to claim 10, wherein, the range of ion energy is determined according to the thickness difference.

12. The CMP method according to claim 1, wherein, the material for the insulating layer comprises silicon dioxide.

13. The CMP method according to claim 1, wherein, ions used in an ion implantation comprise at least one of: H, C, N, B, $BF_2$, In, P, As and Sb.

14. The CMP method according to claim 1, wherein, the process of CMP uses alkali $SiO_2$-based slurry or alkali $CeO_2$-based slurry; and uses a hard pad or a soft pad.

15. A method for fabricating a metal gate in gate-last process, comprising:
   providing a substrate comprising a dummy gate and source/drain regions on the sides of the dummy gate, the dummy gate and the source/drain regions being overlay by an insulating layer, and the insulating layer comprising a protruding part above the dummy gate and a recessed part above a surface of the substrate between dummy gates;
   selectively doping the insulating layer such that only the protruding part is doped;
   performing first chemical-mechanical planarization (CMP), to remove the protruding part such that a first insulating layer on top of the dummy gate is exposed;
   performing second CMP, to remove the first insulating layer on the top of the dummy gate such that the dummy gate is exposed;
   removing the dummy gate such that a gate trench is formed;
   filling the gate trench with metal; and
   performing third CMP, to remove excess metal on the surface of the substrate outside the gate trench and form a metal gate.

* * * * *